United States Patent
Sugimura et al.

(10) Patent No.: US 8,310,085 B2
(45) Date of Patent: Nov. 13, 2012

(54) ELECTRICAL JUNCTION BOX FOR VEHICLE

(75) Inventors: Yoshiaki Sugimura, Yokkaichi (JP); Tsuyoshi Hosono, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 277 days.

(21) Appl. No.: 12/734,230

(22) PCT Filed: May 27, 2008

(86) PCT No.: PCT/JP2008/059694
§ 371 (c)(1),
(2), (4) Date: Apr. 20, 2010

(87) PCT Pub. No.: WO2009/066480
PCT Pub. Date: May 28, 2009

(65) Prior Publication Data
US 2010/0231038 A1 Sep. 16, 2010

(30) Foreign Application Priority Data
Nov. 21, 2007 (JP) ................................. 2007-301219

(51) Int. Cl.
*B60L 1/00* (2006.01)
*B60L 3/00* (2006.01)
*H02G 3/00* (2006.01)
(52) U.S. Cl. ...................................... 307/10.1; 439/76.2
(58) Field of Classification Search .................. 307/9.1, 307/10.1; 439/76.2; 361/736, 601
See application file for complete search history.

(56) References Cited

U.S. PATENT DOCUMENTS
6,700,795 B1 * 3/2004 Jones et al. .................... 361/784

FOREIGN PATENT DOCUMENTS
| JP | A-9-63668 | 3/1997 |
| JP | A-10-116960 | 5/1998 |
| JP | A-2007-043810 | 2/2007 |
| JP | A-2007-228691 | 9/2007 |
| JP | A-2007-228757 | 9/2007 |

OTHER PUBLICATIONS

International Search Report issued on Aug. 26, 2008 in International Application No. PCT/JP/059694 (with translation).

* cited by examiner

*Primary Examiner* — Carlos Amaya
(74) *Attorney, Agent, or Firm* — Oliff & Berridge, PLC

(57) ABSTRACT

An object of this invention is to provide an electrical junction box for a vehicle that can effectively restrain a control circuit from being subject to heat adverse effect from to a power distribution circuit, can downsize the whole structure, and can reduce the number of terminals for connecting the circuits to each other. The electrical junction box for a vehicle comprises a power distribution unit for constituting a part of the power distribution circuit, and a circuit board. A board body of the circuit board is divided into a power distribution circuit region Ap and a control circuit region Ac by a border line BL across the circuit board body. The control circuit is incorporated in the control circuit region Ac. The power distribution circuit region Ap is provided with a power distribution circuit having a current specification smaller than that of the power distribution circuit on the power distribution unit.

7 Claims, 4 Drawing Sheets

US 8,310,085 B2

ELECTRICAL JUNCTION BOX FOR VEHICLE

FIELD OF THE INVENTION

This invention relates to an electrical junction box for a vehicle that constitutes a power distribution circuit for distributing a power source mounted on a vehicle such as a motor vehicle to a plurality of vehicle-mounted loads.

BACKGROUND OF THE INVENTION

Heretofore, an electrical junction box for a vehicle has been known which includes a power distribution circuit for distributing a power source for a vehicle to a plurality of vehicle-mounted loads, and a control circuit for controlling an on-off action of switching elements (for example, a relay switch, and a transistor) included in the power distribution circuit.

For example, an electrical junction box disclosed in Patent Document 1 includes a wiring board for constituting the power distribution circuit, and an ECU board for controlling an on-off action of a semiconductor relay packed on the wiring board. The ECU board includes a board body, and a plurality of L-shaped terminals projecting downward from the board body. When these L-shaped terminals are connected to suitable positions on a power distribution unit, the power distribution circuit formed on the wiring board and the control circuit on the ECU board are electrically interconnected.

In the electrical junction box, since the semiconductor relay having a relatively great calorific value is packed on a wiring board side while the control circuit that is weak in a relatively high temperature is incorporated in an ECU board side, it is possible to restrain the control circuit from being subject to a heat adverse effect due to a heat generated from the semiconductor relay.

However, the electrical junction box disclosed in Patent Document 1 involves the following problems to be overcome.

a. It is difficult to reduce a difference in area between the wiring board that constitutes the power distribution circuit and the ECU board that constitutes the control circuit. This difference in area will interfere with downsizing of the whole of the electrical junction box. In general, as shown in FIGS. 2 and 3 in Patent Document 1, since the wiring board that constitutes the power distribution circuit must widen a width of a wiring pattern in order to comply with a great current, the area of the wiring board becomes greater than that of the ECU board mounting only the circuit board. This difference in area will become great as the power distribution circuit becomes complicated. It will be difficult to effectively contain both boards in a single casing assembly as the difference in area becomes great. In result, it will become difficult in downsizing of the casing assembly.

b. A number of terminals are required for interconnecting the power distribution circuit on the wiring board and the control circuit on the ECU board. In addition, the number of the terminals will increase as the switching elements included in the power distribution circuit increase. Such increase of the number of the terminals will invite upsizing of a connector including the terminals, thereby interfering with enhancement of reliability in connection. Patent Document JP 2007-228757 A

SUMMARY OF THE INVENTION

In view of the above problems, an object of the present invention is to provide an electrical junction box for a vehicle that can effectively restrain a control circuit from being subject to a heat adverse effect from a power distribution circuit, can downsize a whole structure, and can reduce the number of terminals for connecting the circuits to each other.

Means for Solving the Problems

In order to solve the above problems, the present invention is directed to an electrical junction box for a vehicle that comprises a power distribution circuit for distributing a power source mounted on a vehicle to a plurality of vehicle-mounted loads, a plurality of switching elements provided on the power distribution circuit for turning on and off current-carrying between the power source and the vehicle-mounted loads, a control circuit for controlling an on-off action of the switching elements, a power distribution unit for constituting a part of the power distribution circuit, and a circuit board having a board body in which the control circuit is incorporated. The board body of the circuit body is divided into a power distribution circuit region and a control circuit region by a border line across the board body. The control circuit region is provided with a conductive pattern for forming the control circuit and with a control circuit element. The power distribution circuit region is provided with a part of the plural switching elements and with a conductive pattern for connecting the part of the switching elements to the power source and the vehicle-mounted loads. The electrical junction box satisfies at least one of the following conditions A and B.

A) The switching elements provided on the power distribution circuit region includes only switching elements having load currents smaller than those of the switching elements included in the power distribution unit except the former switching elements.

B) The conductive pattern provided on the power distribution circuit region includes only conductive patterns having thicknesses smaller than those of the conductive patterns included in the power distribution unit.

DETAILED DESCRIPTION OF THE INVENTION

Figure 1:
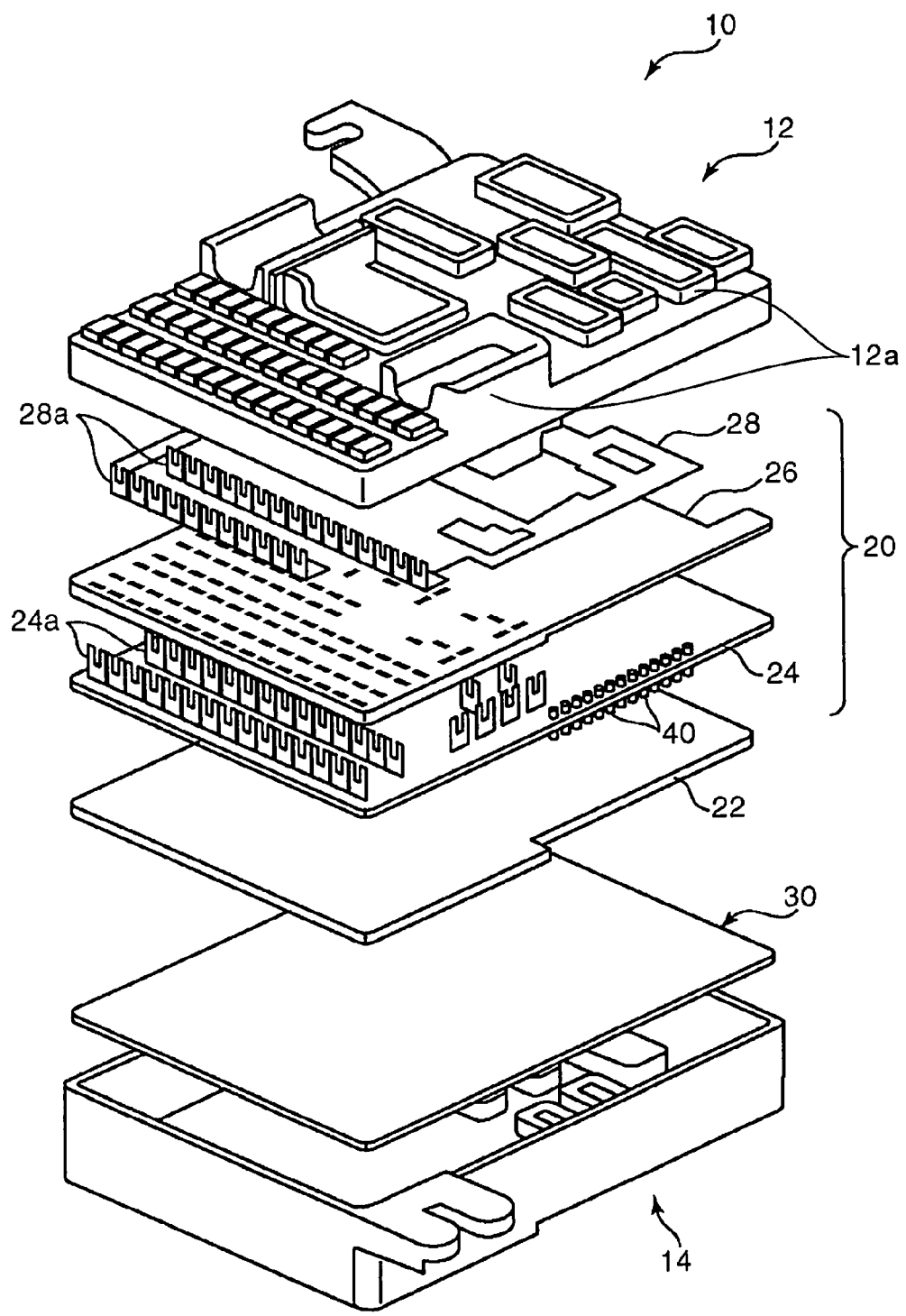
FIG. 1 is an exploded perspective view of an embodiment of an electrical junction box for a vehicle in accordance with the present invention.

Preferable embodiments of an electrical junction box for a vehicle in accordance with the present invention will be described below by referring to the drawings.

FIG. 1 is an exploded perspective view of an embodiment of an electrical junction box 10 for a vehicle in accordance with the present invention. The electrical junction box 10 includes an upper casing 12, a lower cover 14, a power distribution unit 20, and a circuit board 30. When the upper casing 12 and lower cover 14 are coupled to each other in a vertical direction, they constitute the electrical junction box 10. The power distribution unit 20 is laminated on the circuit board 30 in a plate thickness direction so that they are contained in a casing assembly.

The power distribution unit 20 is constructed by laminating an insulation plate 22, a wiring board 24, an insulation plate 26, and a bus bar 28 upward in order. The wiring board 24 includes a board body made of glass fiber, synthetic resin, or the like, and a conductive pattern (not shown). The conductive pattern and bus bar 28 constitute a part of a power distribution circuit. The power distribution circuit serves to distribute a power source mounted on a vehicle to a plurality of loads for a vehicle. The power distribution unit 20 constitutes only a part of the power distribution circuit having a great current specification. Preferably, the conductive pattern included in the wiring board 24 is four layers of laminating copper foils with a thickness, for example, 105 μm, suitable for a great current.

The conductive pattern on the wiring board 24 and a part of the bus bar bent upward are provided with external connection terminals 24a and 28a. On the other hand, the upper casing 12 is provided on a suitable position with a hood 12a that is open downward. The external connection terminals 24a and 28a project into the hood 12a to form connectors, respectively. The connectors are coupled to external parts (for example, fuses and relays) that are arranged outside the electrical junction box 10.

A plurality of pin terminals 40 are disposed on right and left side edges of the wiring board 24. The pin terminals 40 serve to electrically connect a power distribution circuit at the side of the wiring board 24 to a power distribution circuit at the side of a circuit board 30 mentioned after. The pin terminals 40 are inserted into the board body of the wiring board 24 in a thickness direction (a vertical direction in FIG. 1) and are soldered on the wiring board 24.

Figure 2:
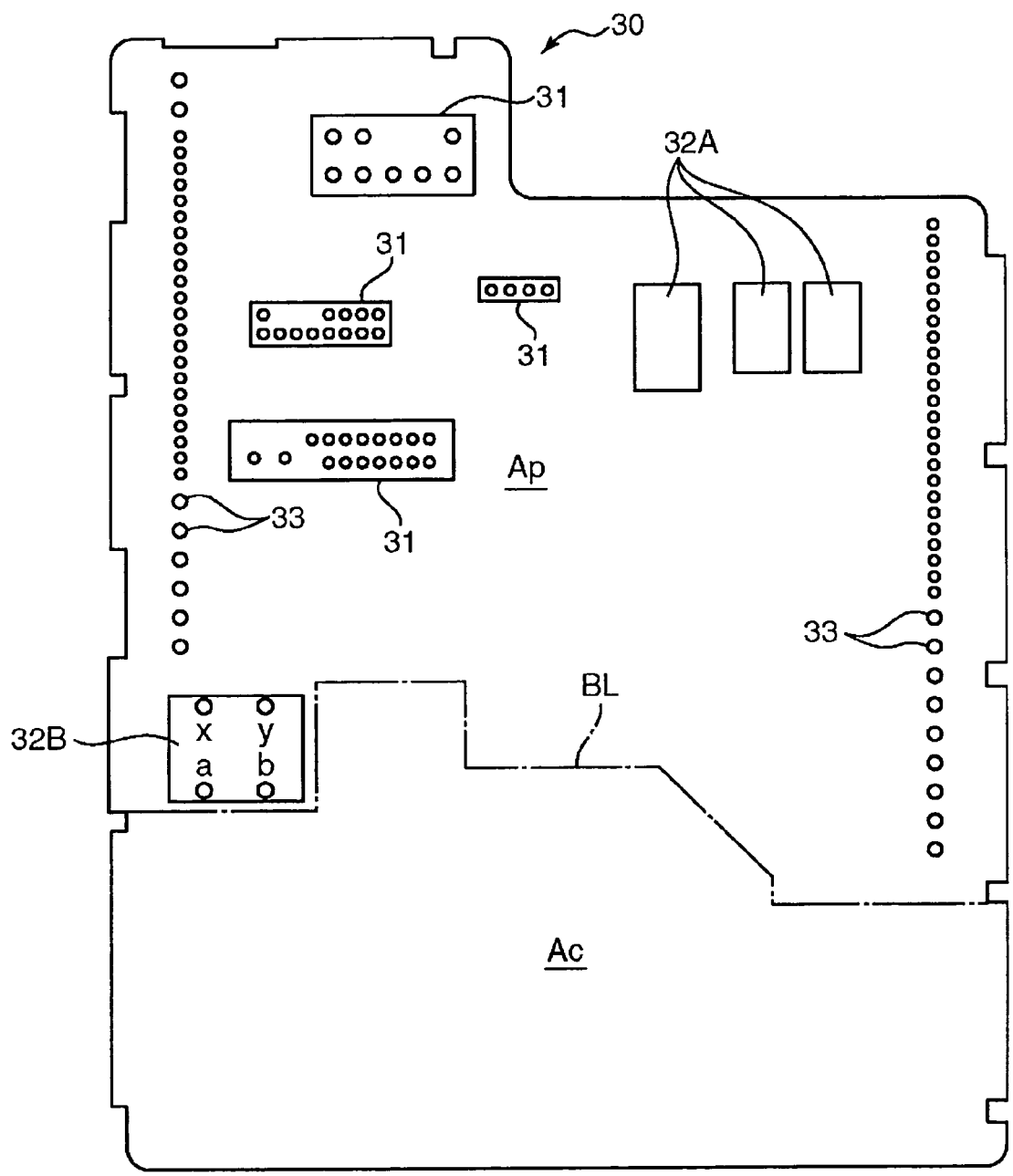
FIG. 2 is a bottom view of a circuit board to be installed in the electrical junction box shown in FIG. 1.

The circuit board 30 includes a board body made of an insulation material such as glass fiber or synthetic resin. A control circuit and a part of the power distribution circuits (specifically, a small current specification circuit excluded from the power distribution unit 20 out of the above power distribution circuits) are incorporated in the board body. Preferably, the conductive pattern included in the circuit board 30 is a laminated thin copper foils (for example, two or four layers of copper foils having a thickness of 35 μm) suitable for a small current and a control signal. Specifically, as shown in FIG. 2 that illustrates a bottom view of the circuit board 30, the board body of the circuit board 30 is divided into a control circuit region Ac and a power distribution circuit region Ap by a border line BL extending across the board body.

A conductive pattern (not shown) that constitutes a control circuit for a control signal specification is disposed on the control circuit region Ac. Semiconductor parts such as microcomputers, memories, transistors, and diodes and circuit elements such as resistors, capacitors are packed on suitable positions on the control circuit region Ac by reflow soldering in another step.

A conductive pattern (not shown) that constitutes the control circuit for the small current specification is disposed on the power distribution circuit region Ap. An external connecting connector 31, a plurality of relay elements 32A, and a particular relay element 32B are packed on suitable positions on the power distribution circuit region Ap. These external connecting connector and relay elements are packed on the power distribution circuit region Ap by a soldering method suitable for attachment of the parts. Specifically, the parts suitable for the reflow soldering are packed on the control circuit region Ac simultaneously with packing the circuit parts on the control circuit region Ac in another step mentioned above. The parts suitable for flow soldering are packed on the circuit board 30 at the same time when the pin terminals 40 are soldered on the circuit board 30, as mentioned after.

A plurality of pin terminals 33 are arranged on right and left edges in the power distribution circuit region Ap.

Each pin terminal connecting portion 33 constitutes a power distribution connecting portion for electrically coupling the power distribution circuit on the power distribution circuit region Ap and the power distribution circuit on the power distribution unit 20 to each other. Specifically, each pin terminal connecting portion 33 is provided with a throughhole having a small diameter that penetrates the circuit board 30, and when each pin terminal 40 is inserted into the pin terminal connecting portion 33, the pin terminals 40 are electrically connected to the conductive pattern on the power distribution circuit region Ap by the flow soldering. That is, the pin terminals 40 are interposed between the respective pin terminal connection portions 33 and the power distribution unit 20 in the electrical junction box 10 to extend in a direction parallel to a laminating direction of them (in upper and lower directions in FIG. 1). The respective terminals 40 are connected to the circuit board 30 and power distribution unit 20 by the flow soldering.

A specific soldering method is not limited to the reflow soldering. For example, the method may be a manual soldering manner using a soldering iron or a soldering robot.

The external connecting connector 31 serves to connect a circuit outside the electrical junction box 10 to the power distribution circuit on the power distribution circuit region Ap directly without interposing the pin terminals 40.

The relay elements 32A and 32B are incorporated in the power distribution circuit and they are switching elements that turn on and off currents between a vehicle-mounted power source and corresponding vehicle-mounted loads. The relay elements 32A and 32B include a pair of conducting terminals interposed in the power distribution circuit, and a control terminal to which a control signal is applied so as to turn on off currents between these conducting terminals. The control terminal of each relay element 32A is connected to the conductive pattern on the power distribution circuit region Ap and receives a control signal from the conductive pattern. On the other hand, the control terminal of each relay element 32B receives a control signal from the control circuit on the control circuit region Ac.

Figure 3:
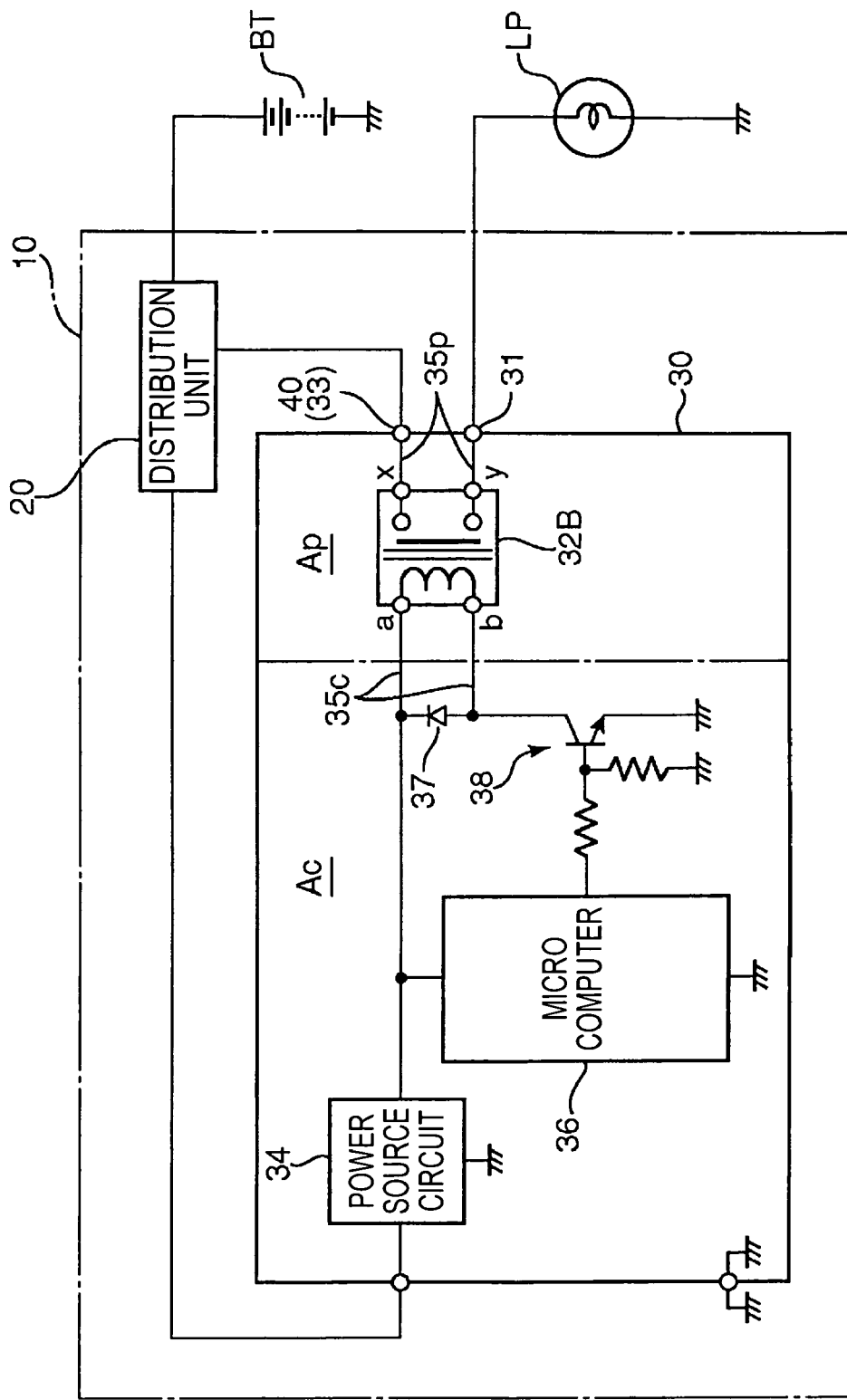
FIG. 3 is a circuit diagram of a particular relay element to be installed in the electrical junction box shown in FIG. 1.
Figure 4:
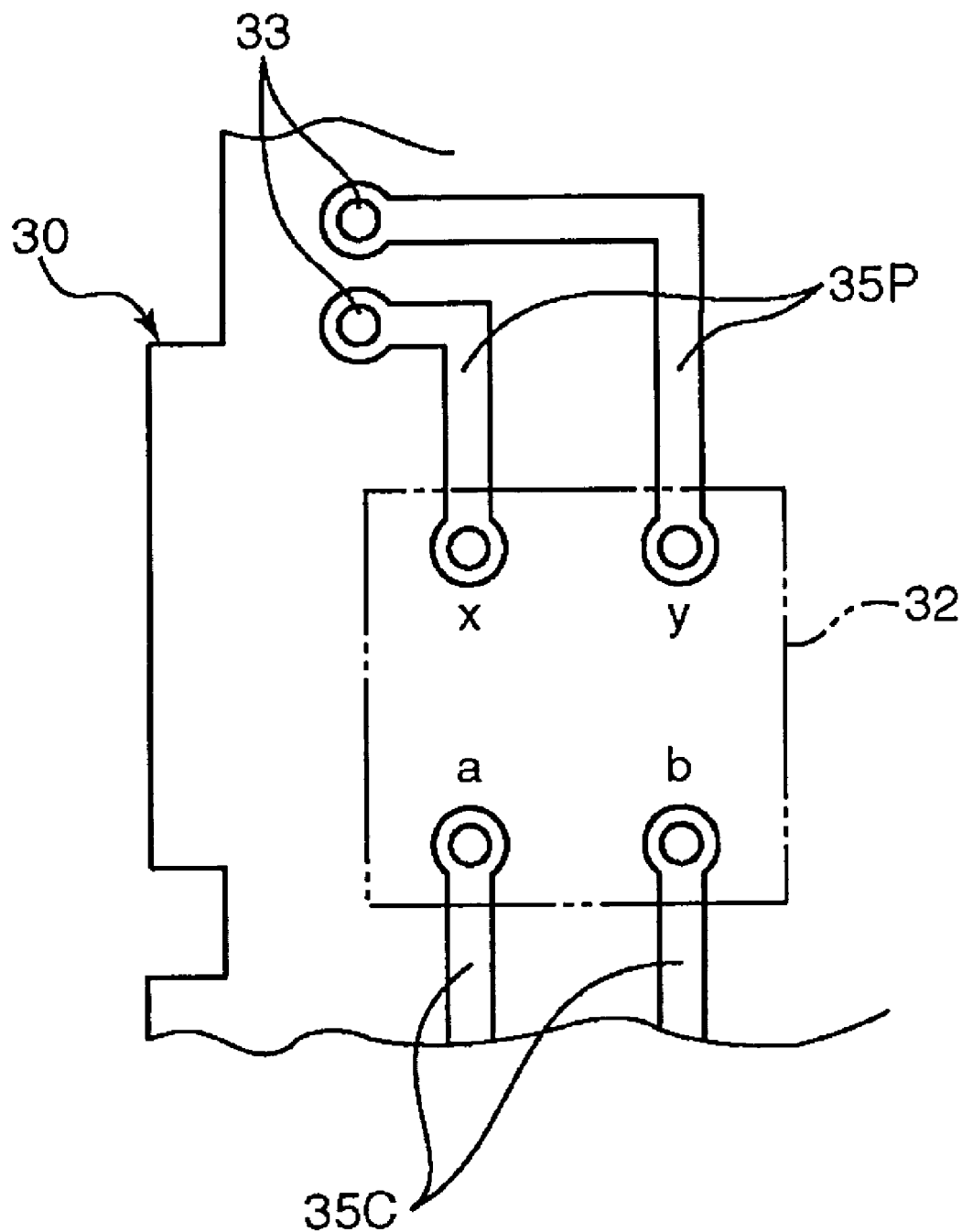
FIG. 4 is a plan view of a conductive pattern to be connected to the particular relay element shown in FIG. 2.

FIG. 3 shows a circuit of concerning the particular relay element 32B. The relay element 32B includes a power source side conducting terminal x and a load side conducting terminal y that serve as the conducting terminals. The power source side conducting terminal x is connected through the power distribution unit 20 to a battery BT that serves as the vehicle-mounted power source. The load side conducting terminal y is connected to a load (a lamp LP in FIG. 3) having a relatively small current specification. Specifically, the power distribution unit 20 is connected to the battery BT and is connected through a suitable pin terminal 40 and a conductive pattern 35p disposed on the power distribution circuit region Ap also shown in FIG. 4 to the power source side conducting terminal x. Also, the load side conducting terminal y is connected through the conductive pattern 35p disposed on the power distribution circuit region Ap and the external connecting connector 31 to the lamp LP.

The particular relay element 32B includes a power source side coil terminal a and a ground side coil terminal b that serve as the control terminals, and a relay coil provided between the coil terminals a and b. When a current flows in the relay coil, the control circuit on the control circuit region Ac effects an on-off switching action. As shown also in FIG. 4, the both coil terminals a and b are electrically connected through a conductive pattern 35c led out of the control circuit region Ac to the control circuit.

The control circuit includes a power source circuit 34, a diode 37, a transistor 38, and a microcomputer 36. The power source circuit 34 applies a low voltage power source to the power source side coil terminal a and the microcomputer 36. The diode 37 is interposed between the both coil terminals a and b to prevent a short circuit from the power source side coil terminal a to the ground side coil terminal b. The transistor 38 is interposed between the ground side coil terminal b and a ground and receives a control signal from the microcomputer 36 to effect the on-off switching action. Only when the transistor 38 turns on, the ground side coil terminal b is connected to the ground and a current flows in the relay coil between the coil terminals a and b, thereby electrically interconnecting the conducting terminals x and y. That is, the battery BT and lamp LP are electrically interconnected.

The "switching element" in the present invention is not limited to the relay element. For example, it may be a semiconductor element having a switching function, such as an FET.

Since the control circuit and a part of the power distribution circuits to be controlled by the control circuit are incorporated in the common circuit board 30, it is possible to equalize an area of the circuit board 30 with an area of the power distribution unit 20 that constitutes a part of the power distribution circuit in comparison with a conventional electrical junction box in which only the control circuit is installed on the circuit board 30. This can downsize the whole of the electrical junction box. For example, as shown in FIG. 1, it is possible to substantially equalize the area of the circuit board 30 with the area of the power distribution unit 20 and to substantially accord profiles of the board 30 and unit 20 with inner shapes of the upper casing 12 and lower cover 14. This can enhance an efficiency of containing space in the casing assembly dramatically.

Since it is possible to electrically connect the control circuit to the particular relay element 32B on the circuit board 30 by, for example, the conductive pattern, it is possible to reduce the number of the terminals for interconnecting the circuit board and the power distribution unit.

On the other hand, since the circuit board body of the circuit board 30 is divided into the power distribution circuit region Ap and the control circuit region Ac by the border line BL across the board body, it is possible to locate the control circuit on the control circuit region Ac away from heat generating sources such as the relay elements 32A and 32B on the power distribution circuit region Ap, and the conductive pattern. This can effectively restrain the control circuit from being subject to heat adverse effect from the power distribution circuit.

Further, since only the small current specification circuit out of the power distribution circuits can be disposed on the power distribution circuit region Ap, it is possible to further reduce the heat adverse effect. Specifically, only the power distribution circuit that satisfies at least one of the following conditions A and B may be formed on the power distribution circuit region Ap.

A) Load currents in the switching elements (for example, relay elements 32A and 32B in the drawings) provided on the power distribution circuit region Ap are smaller than those in the switching element included in the power distribution unit 20 (excluding the former switching elements).

B) A thickness of the conductive pattern on the power distribution circuit region Ap is smaller than that of the conductive pattern included in the power distribution unit 20 (a thickness of the conductive pattern included in the wiring board 24 or a thickness of the bus bar 28 in the present embodiment).

By providing only the power distribution circuit that satisfies the above conditions A and/or B on the power distribution circuit area Ap, it is possible to more effectively restrain the heat adverse effect from the power distribution circuit region Ap to the control circuit region Ac.

Further, since the power distribution connecting portions (pin terminal connecting portions 33) that electrically interconnect the power distribution circuit on the power distribution circuit region Ap and the power distribution circuit including the power distribution unit 20 in the electrical junction box, it is possible to easily coordinate the power distribution circuits with each other. It is also possible to further reduce the heat adverse effect from a side of the power distribution unit 20 to the control circuit.

Particularly, in the structure illustrated in the drawings, since the pin terminals 40 are interposed between the circuit board 30 and the power distribution unit 20 to extend in a direction parallel to the laminating direction of them and the pin terminals 40 are connected to the pin terminal connecting portions 33 of the circuit board 30 and to the power distribution unit 20 by soldering, it is possible to surely interconnect the power distribution unit 20 and the circuit board 30 by a simple structure.

In addition, since the power distribution circuit included in the power distribution circuit region Ap is the small current specification circuit, a heat capacity of a constituent element (for example, a conductive pattern) of the power distribution circuit becomes small. Accordingly, it is possible to avoid a failure in soldering due to a difference between the heat capacity of a side of the power distribution circuit region Ap and the heat capacity of a side of the control circuit region Ac. If the heat capacity of the power distribution region side is significantly greater than that of the control circuit side, when any parts are soldered at both regions, in particular when the respective connecting portions are connected by the reflow soldering, heating for a long time due to soldering at the control circuit region side will melt again a solidified solder on the control circuit region side in which the soldering is already finished by another step, a failure in packing of electronic parts or the like at the control circuit region side will occur, or the parts will be deteriorated. However, such troubles can be avoided by reduction of the difference in heat capacity.

Further, the present invention is preferable to lead flow soldering in which heating of solder will generate a high temperature in comparison with a lead containing solder.

The board body of the circuit board 30 may be a single pattern layer (the conductive pattern disposed on an insulation plate) or a plurality of pattern layers. In the latter case, the respective patterns may be designed so that a portion included in the power distribution circuit region Ap out of the conductive patterns on the respective pattern layers constitutes the power distribution circuit and a portion included in the control circuit region Ac constitutes the control circuit.

As described above, since the control circuit that controls the on-off action of the switching elements and a part of the power distribution circuit are incorporated in the common circuit board, it is possible to equalize the area of the circuit board with the area of the power distribution unit that constitutes a part of the power distribution circuit in comparison with the conventional electrical junction box in which only the control circuit is mounted on the circuit board. This can downsize the whole of the electrical junction box.

It is also possible to electrically connect the control circuit to at least a part of the switching elements on the circuit board. Accordingly, it is possible to reduce the number of the terminals for interconnecting the circuit board and the power distribution unit. This will enable to downsize the connector including the terminals and to enhance reliability in connection.

In addition, since the board body of the circuit board is divided into the power distribution circuit region and the control circuit region by the border line across the board body, it is possible to locate the control circuit on the control circuit region away from heat generating sources such as the switching elements on the power distribution circuit region, and the conductive pattern.

Further, since the power distribution circuit region includes A) only the switching elements that have load currents smaller than those of the switching elements included in the power distribution unit except the former switching elements on the power distribution region, or B) the conductive pattern region includes only the conductive pattern having a thickness smaller than that of the conductive pattern included in the power distribution unit, it is possible to restrain a calorific value from the power distribution region.

That is, since only the switching elements in which the current loads and the calorific values are small, or the conductive pattern in which a thickness and a current capacity are small are selected from the power distribution circuit in the electrical junction box and it is disposed in the power distribution circuit region, it is possible to restrain the heat adverse effect from the power distribution circuit region to the control circuit region.

It is more preferable that the circuit board is provided on the power distribution circuit region with power distribution connecting portions that electrically interconnect the power distribution circuit on the power distribution circuit region and the power distribution circuit on the power distribution unit. Since such power distribution connecting portions are provided on the power distribution circuit region, it is possible to facilitate cooperation between the power distribution circuit on the power distribution circuit region and the power distribution circuit on the power distribution unit side and to restrain the heat adverse effect from the power distribution unit side to the control circuit.

In this case, the power distribution circuit region of the circuit board includes a particular switching element comprising a pair of current-carrying terminals in the power distribution circuit formed on the power distribution circuit region and a control terminal to which a control signal is applied to turn on and off a current flow between the current-carrying terminals. The current-carrying terminals of the particular switching element are connected through the conductive pattern on the power distribution circuit region to the power distribution connecting portions. Preferably, the control terminal of the particular switching element is connected through the conductive pattern led out of the control circuit region to the control circuit.

According to the above structure, the current-carrying terminal and control terminal included in the particular switching element are connected to the power distribution circuit and control circuit in a simple and compact manner.

A casing assembly is provided to arrange and contain the power distribution unit and circuit board. The power distribution unit and circuit board are contained in the casing assembly so that they are laminated in parallel to the thickness direction of the circuit board and are adjacent to each other. Preferably, the power distribution circuit on the power distribution circuit region of the circuit board is connected through the power distribution connecting portions to the power distribution unit in the direction parallel to the laminating direction of the power distribution unit.

Such arrangement can contain the power distribution unit and circuit board in the casing assembly in the most compact manner. In addition, since the power distribution unit and circuit board can be approached to each other in the laminating direction, it is possible to shorten a length of a terminal or the like for interconnecting the power distribution unit and the circuit board in the same direction.

More specifically, it is preferable that the pin terminals extending in the direction parallel to the laminating direction are interposed between the power distribution connecting portions of the circuit board and the power distribution unit, and that the pin terminals are connected to the power distribution connecting portions of the circuit board and the power distribution unit by soldering. Although this structure is simple, it is possible to surely interconnect the power distribution unit and the circuit board.

In addition, as described above, since the power distribution circuit included in the power distribution circuit region has the small current specification, the heat capacity of the conductive pattern or the like included in the power distribution circuit region is smaller than that of the power distribution unit. This can avoid a failure in soldering due to the difference between the heat capacity of the power distribution circuit region side and the heat capacity of the control circuit region side.

Also, equalization of the areas of the power distribution unit and circuit board can accord, for example, their shapes with the inner shape of the casing assembly. Setting such shapes can enhance an efficiency of containing space of the power distribution unit and circuit board in the casing assembly.

The invention claimed is:

1. An electrical junction box for a vehicle, comprising:
a power distribution circuit for distributing a power source mounted on a vehicle to a plurality of vehicle-mounted loads;
a plurality of switching elements provided on said power distribution circuit for turning on and off current-carrying between said power source and said vehicle-mounted loads;
a control circuit for controlling an on-off action of said plurality of switching elements;
a power distribution unit for constituting a part of said power distribution circuit; and
a circuit board having a board body in which said control circuit is incorporated;
wherein said board body of said circuit body is divided into a power distribution circuit region and a control circuit region by a border line across said board body, said control circuit region is provided with a conductive pattern for forming said control circuit and with a control circuit element, said power distribution circuit region is provided with a part of said plurality of switching elements and with a conductive pattern for connecting said part of said plurality of switching elements to said power source and said vehicle-mounted loads;
wherein said plurality of switching elements provided on said power distribution circuit region includes only switching elements having load currents smaller than those of said plurality of switching elements included in said power distribution unit; and
wherein said power distribution circuit region on said circuit board is provided with power distribution connecting portions for electrically interconnecting said power distribution circuit on said power distribution circuit region and said power distribution circuit constructed by said power distribution unit, said power distribution circuit region on said circuit board includes a particular one of said switching elements having a pair of current-carrying terminals provided in said power distribution circuit on said power distribution circuit region and a control terminal to which a control signal is applied to turn on and off current-carrying between said current-carrying terminals, said current-carrying terminals of said particular one of said switching elements is connected through said conductive pattern on said power distribution circuit region to said power distribution connecting portions, and said control terminal of said particular one of said switching elements is connected through a conductive pattern led out of said control circuit region to said control circuit.

2. An electrical junction box for a vehicle according to claim 1, wherein a casing assembly is provided to contain said power distribution unit and said circuit board, said power distribution unit and said circuit board are laminated adjacent each other in a direction parallel to a thickness direction of said circuit board and are contained in said casing assembly, said power distribution circuit on said power distribution circuit region is connected through said power distribution connecting portions to said power distribution unit in a direction parallel to said laminating direction.

3. An electrical junction box for a vehicle according to claim 2, wherein pin terminals are disposed between said power distribution connecting portions on said circuit board and said power distribution unit to extend in the direction parallel to said laminating direction, and said pin terminals are connected to said power distribution connecting portions on said circuit board and said power distribution unit by soldering.

4. An electrical junction box for a vehicle according to claim 3, wherein said power distribution unit and said circuit board have shapes that substantially accord with an inner shape of said casing assembly.

5. An electrical junction box for a vehicle according to claim 2, wherein said power distribution unit and said circuit board have shapes that substantially accord with an inner shape of said casing assembly.

6. An electrical junction box for a vehicle, comprising:
a power distribution circuit for distributing a power source mounted on a vehicle to a plurality of vehicle-mounted loads;
a plurality of switching elements provided on said power distribution circuit for turning on and off current-carrying between said power source and said vehicle-mounted loads;
a control circuit for controlling an on-off action of said plurality of switching elements;
a power distribution unit having conductive patterns for constituting a part of said power distribution circuit; and
a circuit board having a board body in which said control circuit is incorporated;
wherein said board body of said circuit body is divided into a power distribution circuit region and a control circuit region by a border line across said board body, said control circuit region is provided with a conductive pattern for forming said control circuit and with a control circuit element, said power distribution circuit region is provided with a part of said plurality of switching elements and with a conductive pattern for connecting said part of said plurality of switching elements to said power source and said vehicle-mounted loads;
wherein said conductive pattern provided on said power distribution circuit region includes only conductive patterns having thicknesses smaller than those of said conductive patterns included in said power distribution unit; and
wherein said power distribution circuit region on said circuit board is provided with power distribution connecting portions for electrically interconnecting said power distribution circuit on said power distribution circuit region and said power distribution circuit constructed by said power distribution unit, said power distribution circuit region on said circuit board includes a particular one of said switching elements having a pair of current-carrying terminals provided in said power distribution circuit on said power distribution circuit region and a control terminal to which a control signal is applied to turn on and off current-carrying between said current-carrying terminals, said current-carrying terminals of said particular one of said switching elements is connected through said conductive pattern on said power distribution circuit region to said power distribution connecting portions, and said control terminal of said particular one of said switching elements is connected through a conductive pattern led out of said control circuit region to said control circuit.

7. An electrical junction box for a vehicle according to claim 6, wherein a casing assembly is provided to contain said power distribution unit and said circuit board, said power distribution unit and said circuit board are laminated adjacent each other in a direction parallel to a thickness direction of said circuit board and are contained in said casing assembly, said power distribution circuit on said power distribution circuit region is connected through said power distribution connecting portions to said power distribution unit in a direction parallel to said laminating direction.

* * * * *